US006493263B1

(12) United States Patent
Shibata et al.

(10) Patent No.: US 6,493,263 B1
(45) Date of Patent: Dec. 10, 2002

(54) SEMICONDUCTOR COMPUTING CIRCUIT AND COMPUTING APPARATUS

(75) Inventors: Tadashi Shibata, Tokyo (JP); Masahiro Konda, Sendai (JP); Tadahiro Ohmi, Sendai (JP)

(73) Assignee: Semiconductor Technology Academic Research Center, Tokyo (JP)

( * ) Notice: Subject to any disclaimer, the term of this patent is extended or adjusted under 35 U.S.C. 154(b) by 218 days.

(21) Appl. No.: 09/615,755

(22) Filed: Jul. 13, 2000

(30) Foreign Application Priority Data

Aug. 9, 1999 (JP) .......................................... 11-225581

(51) Int. Cl.[7] ............................................... G11C 16/04

(52) U.S. Cl. .............................. 365/185.18; 365/185.1; 327/361; 327/355; 708/670

(58) Field of Search ......................... 365/185.03, 185.1, 365/185.18; 327/355, 361; 708/670, 671

(56) References Cited

U.S. PATENT DOCUMENTS

| | | | | |
|---|---|---|---|---|
| 5,258,657 A | | 11/1993 | Shibata et al. | 307/201 |
| 5,521,858 A | | 5/1996 | Shibata et al. | 365/185.03 |
| 5,530,393 A | | 6/1996 | Guerrieri | 327/355 |
| 5,745,416 A | | 4/1998 | Shibata et al. | 365/185.28 |
| 5,864,255 A | | 1/1999 | Kwok | 327/359 |
| 5,923,205 A | | 7/1999 | Shibata et al. | 327/361 |
| 5,939,925 A | * | 8/1999 | Shibata et al. | 327/355 |
| 5,946,235 A | * | 8/1999 | Kramer et al. | 365/185.19 |
| 6,049,235 A | * | 4/2000 | Ichikawa et al. | 327/51 |

FOREIGN PATENT DOCUMENTS

| | | |
|---|---|---|
| JP | 3-6679 | 1/1991 |
| JP | 6-53431 | 2/1994 |
| WO | WO96/30853 | 10/1996 |

OTHER PUBLICATIONS

M. Neal, "Absolute–value–differencer," Electronics World and Wireless World, vol. 97, No. 1663, May 1, 1991, p. 421.

* cited by examiner

*Primary Examiner*—Son Mai
(74) *Attorney, Agent, or Firm*—Finnegan, Henderson, Farabow, Garrett & Dunner, L.L.P.

(57) ABSTRACT

Disclosed is a semiconductor computing circuit achievable with simple circuitry and capable of performing analog computations at high speed to compute an absolute-value voltage representing the difference between a first signal voltage and a second signal voltage. The semiconductor computing circuit comprises: a first MOS transistor having a floating gate and a control gate capacitively coupled to the floating gate; a second MOS transistor having a floating gate and a control gate capacitively coupled to the floating gate, and whose source electrode is connected to the source electrode of the first MOS transistor; a write circuit which, with a prescribed voltage applied to the control gates of the first and second MOS transistors, sets the potential at the floating gate of the first MOS transistor to a value equal to the first signal voltage and also sets the potential at the floating gate of the second MOS transistor equal to a value obtained by subtracting the first signal voltage from the prescribed voltage; and a difference voltage computing circuit for computing a voltage representing a value obtained by subtracting the second signal voltage from the prescribed voltage, and wherein: after setting the first and second MOS transistors by the write circuit, when the output voltage of the difference voltage computing circuit is applied to the control gate of the first MOS transistor while at the same time applying the second signal voltage to the control gate of the second MOS transistor, the absolute-value voltage representing the difference between the first signal voltage and the second signal voltage is output.

19 Claims, 11 Drawing Sheets

Fig.2A
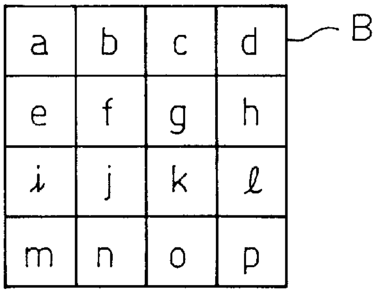
Fig.2B
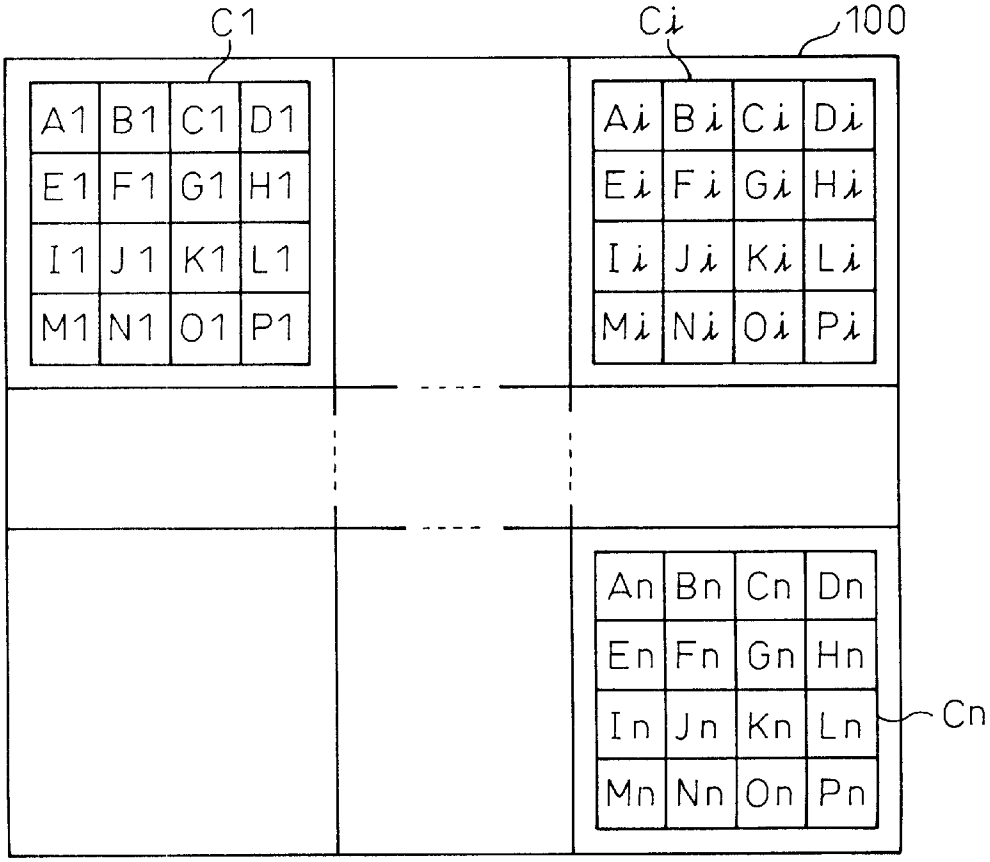
Fig.2C
$$\text{DISTANCE} = |Ai - a| + |Bi - b| + \cdots + |Pi - p|$$

SEMICONDUCTOR COMPUTING CIRCUIT AND COMPUTING APPARATUS

BACKGROUND OF THE INVENTION

The present invention relates to a semiconductor computing circuit for performing computations on analog values and a computing apparatus using the same, and more particularly to a semiconductor computing circuit for computing an absolute difference between two analog signal values and a computing apparatus for computing a Manhattan distance which is a measure of a similarity to a reference pattern.

With the advance of computer technology, dramatic strides have been made in data processing technology in recent years. However, if flexible information processing, such as visual recognition or voice recognition as is done by humans, is to be implemented using a computer, it is said that, with today's digital computers, it is almost impossible to provide computation results in real time. One reason for this is that much of the information we handle in our daily lives is in the form of analog quantities and, when these quantities are represented by digital data, not only does the amount of data become prohibitively large but also the data is inaccurate and ambiguous. It can be said that the problem of today's information processing systems lies in the fact that extremely redundant analog data are converted to digital quantities and rigorous digital computations are performed one by one. Furthermore, in today's information processing systems, computing circuits for performing digital computations and memory for holding digital data are provided as separate elements, and as a result, a long computation time is required because of the bus bottleneck between the computing circuit and the memory.

To solve such problems, attempts are being made to achieve information processing more analogous to the human brain by taking in information from the external world in its original form, i.e., in form of analog quantities, and by performing computations directly on the analog quantities. One such approach to information processing involves evaluating the similarity between an input signal pattern and a prestored analog pattern. More specifically, a large number of voice or image code patterns are stored in advance and, by comparing the input signal pattern with each code pattern for similarity, a code pattern having the highest similarity is selected. Similarity is measured using the Euclidean distance or the Manhattan distance (the sum of absolute differences); since the computation of the Manhattan distance can be accomplished by calculating only differences whereas the computation of the Euclidean distance requires a multiplication as well, and since, in such processing, evaluating the degree of correlation is of major concern and mathematically rigorous computations are not required, it is common to measure similarity using the Manhattan distance. The semiconductor computing circuit of the present invention lends itself to computation of the Manhattan distance.

Various methods have been proposed for performing computations directly on analog quantities. For example, Japanese Unexamined Patent Publication No. 3-6679 discloses a neuron MOS transistor which behaves like a neuron, a nerve cell, and performs summation of a plurality of analog input signals. Japanese Unexamined Patent Publication No. 6-53431 discloses a computing circuit utilizing this neuron MOS transistor. Further, Republished Patent No. WO96/30853 discloses a semiconductor computing circuit which uses two MOS transistors having a floating gate, with their sources or drains connected together, and which, by applying two analog signals and their difference signal to control gates, computes an absolute-value voltage representing the difference between the two analog signals.

When computing the Manhattan distance, usually, the code pattern is predetermined and the similarity between the input signal and the predetermined code pattern is evaluated; once the code pattern is set in the computing circuit, it is desirable that the computation be performed continuously on various image input signals, and it is rare that the code pattern is changed. However, the computing circuit disclosed in the above cited Republished Patent No. WO96/30853 requires that two analog signals or their processed signals be input for each computation. To meet this requirement, a memory for holding code patterns must be provided, and signals read from the memory must be set in each computing cell of the computing circuit each time the computation is performed; this not only increases the computation time but also presents the problem that the wiring for delivering the signals read from the memory to the respective computing cells of the computing circuit becomes enormous. Moreover, if the code pattern is stored in digital signal form, a D/A converter for converting it into an analog signal must be provided, which causes the problem that the amount of circuitry increases.

SUMMARY OF THE INVENTION

It is an object of the present invention to provide a semiconductor computing circuit achievable with simple circuitry and capable of performing analog computations at high speed.

To achieve the above object, the semiconductor computing circuit of the present invention comprises two MOS transistors, each having a floating gate and a control gate capacitively coupled to the floating gate, and whose source electrodes are connected together, and a write circuit for writing a desired voltage to each MOS transistor.

More specifically, the semiconductor computing circuit of the present invention is characterized by the provision of: a first MOS transistor having a floating gate and a control gate capacitively coupled to the floating gate; a second MOS transistor having a floating gate and a control gate capacitively coupled to the floating gate, and whose source electrode is connected to the source electrode of the first MOS transistor; a first write circuit for writing a desired voltage to the floating gate of the first MOS transistor; and a second write circuit for writing a desired voltage to the floating gate of the second MOS transistor.

When computing an absolute-value voltage representing the difference between a first signal voltage $V_M$ and a second signal voltage $V_X$ by using the semiconductor computing circuit, first the potential at one floating gate is set to V. and the potential at the other floating gate to $V_{DD}-V_M$ while applying a prescribed voltage (for example, supply voltage $V_{DD}$) to the two floating gates. In this condition, when $V_{DD}-V_X$ is applied to the one control gate and $V_X$ to the other control gate, the absolute-value voltage representing the difference between the first signal voltage $V_M$ and the second signal voltage $V_X$ is output.

More specifically, the semiconductor computing circuit of the present invention for computing an absolute-value voltage representing the difference between a first signal voltage and a second signal voltage comprises: a first MOS transistor having a floating gate and a control gate capacitively coupled to the floating gate; a second MOS transistor having a floating gate and a control gate capacitively coupled to the floating gate, and whose source electrode is connected to the source electrode of the first MOS transistor; a write circuit which, with a prescribed voltage applied to the control gates of the first and second MOS transistors, sets the potential at the floating gate of the first MOS transistor to a value equal to the first signal voltage and also sets the potential at the floating gate of the second MOS transistor equal to a value obtained by subtracting the first signal voltage from the prescribed voltage; and a difference voltage computing circuit for computing a voltage representing a value obtained by subtracting the second signal voltage from the prescribed voltage, and wherein: after setting the first and second MOS transistors by the write circuit, when the output voltage of the difference voltage computing circuit is applied to the control gate of the first MOS transistor while at the same time applying the second signal voltage to the control gate of the second MOS transistor, an absolute-value voltage representing the difference between the first signal voltage and the second signal voltage is output.

When the difference between the actually obtained voltage and the ideal voltage, occurring due to the ratio of MOS transistor gate capacitance to floating gate to control gate coupling capacitance, becomes a problem, each potential to be written by the write circuit in the above configuration is, for example, multiplied by a positive constant γ smaller than 1 which is related to the coupling capacitance ratio. To obtain the value of the potential multiplied by the constant γ for writing, the write circuit comprises a readout circuit for reading a voltage on a floating gate of a dummy MOS transistor which is equivalent to the first or second MOS transistor, and a correction voltage computing circuit for computing an output difference of the readout circuit occurring when two voltages, the difference between which is equal to the voltage to be written to the first or second MOS transistor, are applied one after the other to the control gate of the dummy MOS transistor, and the write circuit writes a voltage equal to the output difference to the first or second MOS transistor. This output difference corresponds to the value of the potential to be written, multiplied by the constant γ.

Alternatively, in the above configuration, the voltage to be applied to the control gates when setting the potentials of the respective floating gates by the write circuit, and the voltages to be applied to the respective control gates when performing computation, may be divided by the constant γ.

The first and second MOS transistors may be constructed using N-channel MOS transistors or P-channel MOS transistors; in the case of N-channel MOS transistors, the high-level supply voltage $V_{DD}$ is applied as the prescribed voltage, and in the case of P-channel MOS transistors, the low-level supply voltage $V_{SS}$ is applied as the prescribed voltage.

In the semiconductor computing circuit of the present invention, once the floating gate has been set at a potential related to the first signal voltage, the computation can be performed by just inputting the second signal voltage and a voltage related to it without having to use the first signal voltage or a voltage related to it. Accordingly, since the potential once set in the floating gate is maintained in its entirety, there is no need to apply the first signal voltage or a voltage related to it when performing the computation, unless the first signal voltage is changed.

The present invention also provides a computing apparatus for computing the sum of absolute differences between corresponding signals in a first signal group and a second signal group each consisting of a predetermined number of signals, comprising: an individual absolute-value computing circuit having semiconductor computing circuits corresponding in number to the predetermined number of signals and each identical with the semiconductor computing circuit of the present invention; and a summing circuit for computing the sum of outputs of the semiconductor computing circuits in the individual absolute-value computing circuit.

As described above, in each semiconductor computing circuit used in the computing apparatus of the present invention, once the floating gate of the semiconductor computing circuit has been set at a potential related to the first signal voltage, there is no need to apply the first signal voltage or a voltage related to it when performing the computation; this eliminates the need to provide a separate memory for storing the signals of the first signal group corresponding to code patterns, and also the signal path from the memory to the gate of each semiconductor computing circuit can be eliminated.

The summing circuit comprises, for example, a plurality of capacitors each having two terminals, the first terminal and the second terminal, wherein the second terminals of the capacitors are connected together to form a common second terminal; and a MOS transistor whose gate electrode is formed from an extended portion of the common second terminal, wherein the source electrodes of the semiconductor computing circuits in the individual absolute-value computing circuit are respectively connected to the first terminals.

As described above, once the floating gate of the semiconductor computing circuit has been set at a potential related to the first signal voltage, there is no need to apply the first signal voltage or a voltage related to it when performing the computation. Accordingly, the write circuit may be made removable so that the write circuit can be removed from the computing apparatus after writing the desired potential to the floating gate using the write circuit.

BRIEF DESCRIPTION OF THE DRAWINGS

The feature and advantages of the invention will be more clearly understood from the following description taken in conjunction with the accompanying drawings in which:

FIGS. 2A to 2C are diagrams for explaining the computation of the Manhattan distance in the image compression process by vector quantization;

DESCRIPTION OF THE PREFERRED EMBODIMENTS

A description will be given below of embodiments of the present invention as applied to a semiconductor computing circuit forming part of a computing apparatus employed in a vector quantization image compression apparatus.

Figure 1:
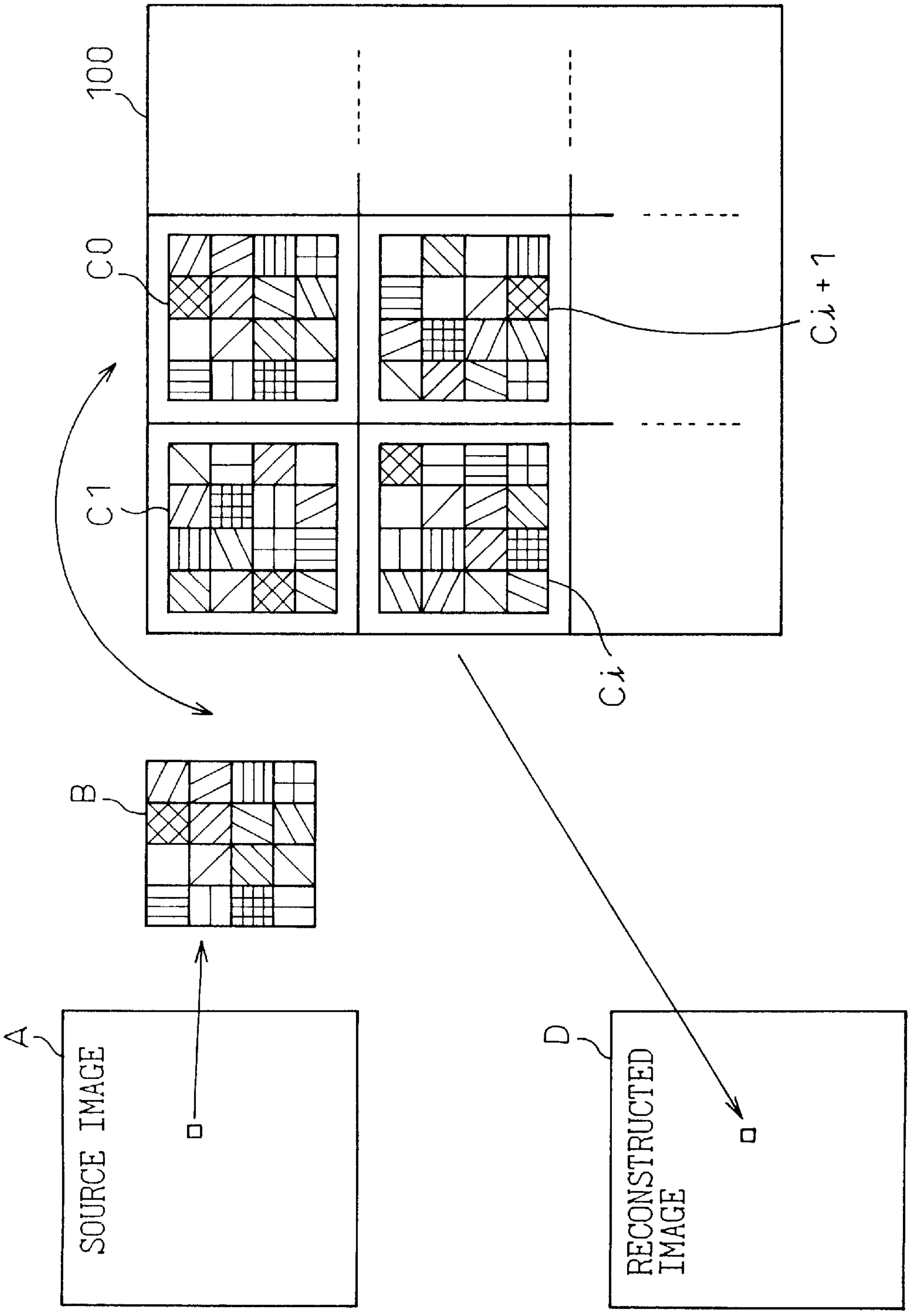
FIG. 1 is a diagram for explaining an image compression process by vector quantization performed in a computing apparatus according to embodiments of the present invention.

FIG. 1 is a diagram for explaining the technique of vector quantization employed in the embodiments of the invention. In FIG. 1, it is assumed that source image A is image data having, for example, 256 grayscale levels with each pixel represented by 8 bits. Here, if a block of 4×4 pixels, i.e., 16 pixels, is taken as one unit, for example, the data amount per unit is 128 bits. The number of patterns that one unit can take is then $2^{128}$. Of these possible patterns, 2048 patterns C1, C2, Ci, . . . are defined and stored in a code book 100. Eleven bits are needed to define the 2048 patterns. The source image A is segmented into a plurality of units B of 4×4 pixels; then, the set of 2048 patterns stored in the code book 100 is searched to locate a pattern that most closely resembles the unit B under consideration, and the pattern code is assigned to the unit and stored. This process is repeated for each unit. When reconstructing the image, the code corresponding to each unit is read from the code book 100 and assigned to the corresponding unit. In this case, a data amount reduction from 128 bits to 11 bits is achieved.

FIGS. 2A to 2C are diagrams for explaining the process of searching for a pattern that most closely resembles each unit. FIG. 2A shows one unit B segmented from the source image A. The unit B consists of 16 pixels whose grayscale data are denoted by a to p, respectively. As shown in FIG. 2B, 2048 patterns C1, . . . , Ci, . . . , Cn are stored in the code book 100, and the pixels in each pattern have grayscale data denoted A1 to P1 in the case of the pattern C1 and An to Pn in the case of the pattern Cn. Here, the pattern that minimizes the sum of the absolute differences in grayscale data between the corresponding pixels, i.e., the Manhattan distance shown in FIG. 2C, is judged to be the closest one. The computing apparatus according to the embodiments of the present invention utilizes analog processing to compute the Manhattan distance and determine the pattern that has the smallest distance. The grayscale data of the pixels in each pattern stored in the code book 100 is called template data, though they are analog signals.

Figure 3:
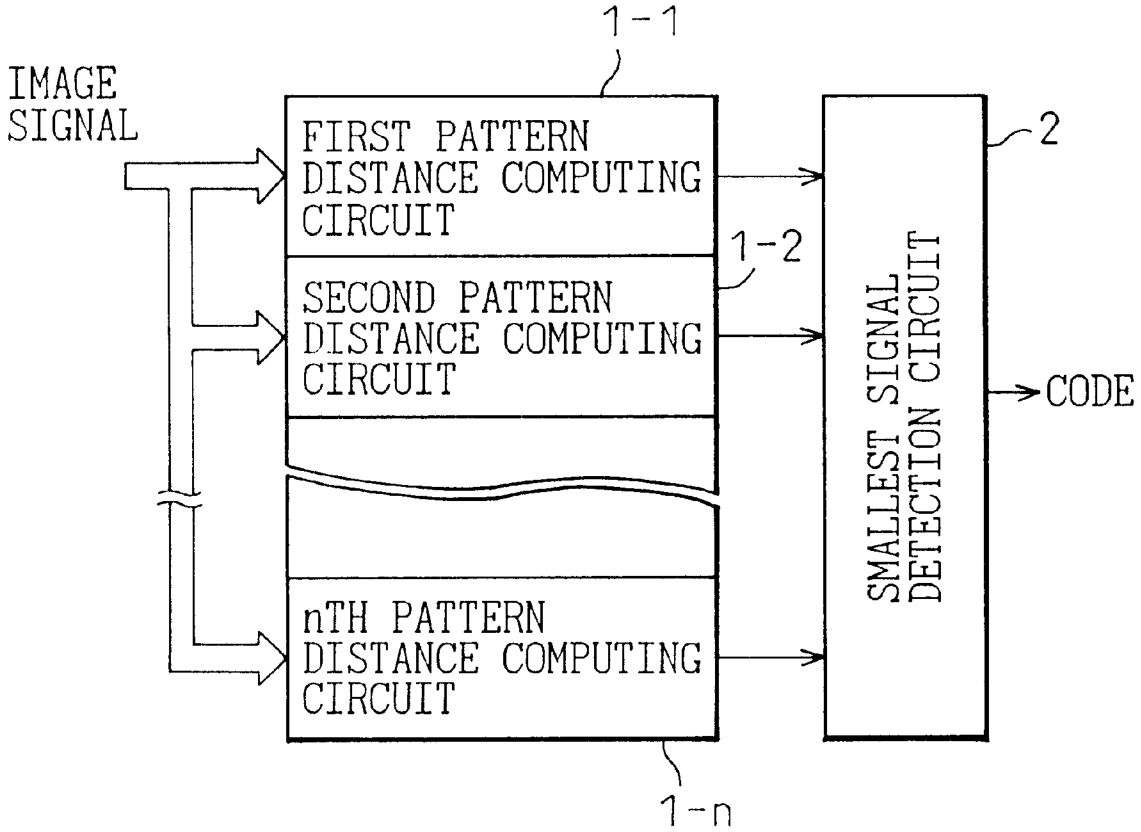
FIG. 3 is a block diagram showing the configuration of the computing apparatus for performing the image compression by vector quantization according to the embodiments of the present invention.

FIG. 3 is a block diagram showing the configuration of the computing apparatus according to the embodiments of the present invention. As shown, the computing apparatus comprises a number, n, of pattern distance computing circuits, i.e., the first to nth pattern distance computing circuits 1-1 to 1-n, and a smallest signal detection circuit 2 which detects the smallest distance from among the distances computed by the first to nth pattern distance computing circuits 1-1 to 1-n and outputs a code indicating the pattern having the smallest distance. The computing apparatus thus outputs the code representing the pattern that most closely matches the image signal. Here, n represents the number of patterns stored in the code book 100; in the example described with reference to FIGS. 1 and 2A to 2C, n is 2048.

The image signal consists of analog signals representing the values of the pixels a to p in each unit when the source image A, as shown in FIG. 1, is segmented into a plurality of units each consisting of 4×4 pixels as shown in FIG. 2A. More specifically, the image signal consists of 16 analog signals which are output in parallel; these signals are either output in parallel using a special TV camera, or generated by reading 16 pieces of data in parallel from a bit map memory where the image data is stored and by converting them into analog form.

The first to nth pattern distance computing circuits 1-1 to 1-n are identical circuits; in operation, the absolute difference between the analog value of each pixel in the image signal and the value of the corresponding template data is calculated, the Manhattan distance between the image signal and each pattern is computed by summing the absolute differences for all (16) pixels, and an analog signal having a strength proportional to the Manhattan distance is output. From among the analog signals representing the Manhattan distance and output from the first to nth pattern distance computing circuits 1-1 to 1-n, the smallest signal detection circuit 32 detects the signal of the smallest strength and outputs the code indicating the pattern having the smallest Manhattan distance, i.e., the pattern that most closely matches the image signal. The smallest signal detection circuit 2 can be constructed using, for example, a winner-take-all circuit, similar to the one described in the previously cited Japanese Unexamined Patent Publication No. 6-53431, that detects the smallest input and outputs a signal indicating that input. A detailed description of this circuit will not be given here.

Figure 4:
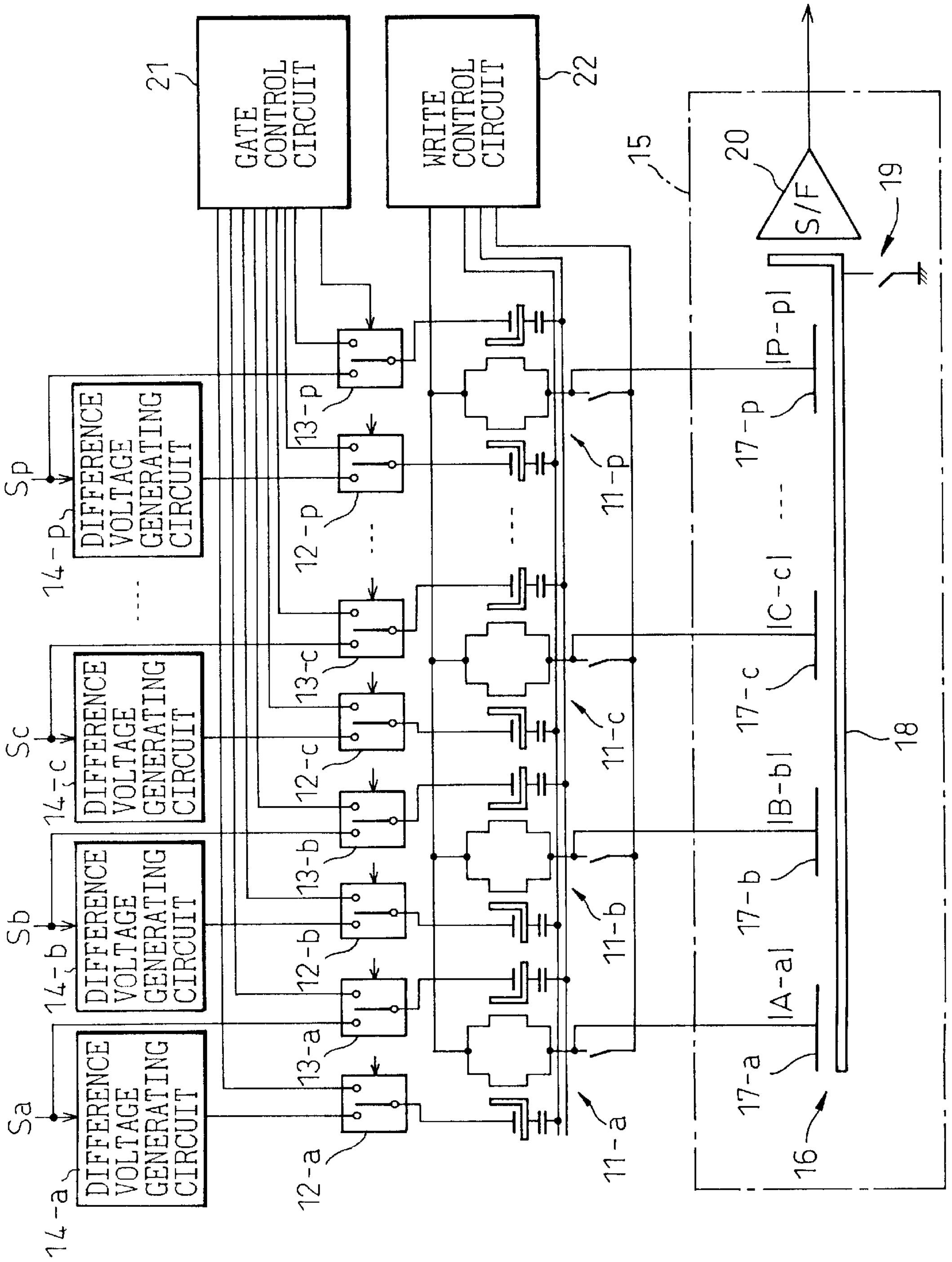
FIG. 4 is a diagram showing the configuration of a pattern distance computing circuit in the computing apparatus of the embodiments.

FIG. 4 is a diagram showing the configuration of one of the first to nth pattern distance computing circuits 1-1 to 1-n. As shown, the pattern distance computing circuit comprises: 16 computing cells 11-a to 11-p; switches 12-a to 12-p and 13-a to 13-p for switching the signals to be applied to the control gates of two N-channel MOS transistors in the respective computing cells; difference voltage generating circuits 14-a to 14-p for computing differences $V_{DD}-V_{Xa}$ to $V_{DD}-V_{Xp}$ between the high level supply voltage $V_{DD}$ and the analog values $V_{Xa}$ to $V_{Xp}$ of the respective pixel signals Sa to Sp in the image signal; a summing circuit 15 for summing the outputs of the computing cells 11-a to 11-p; a gate control circuit 21 for controlling the switches 12-a to 12-p and 13-a to 13-p and for generating voltages to be supplied to these switches; and a write control circuit 22. Template data are written to the respective computing cells, and the absolute differences relative to the signals Sa to Sp are computed.

Figure 6:
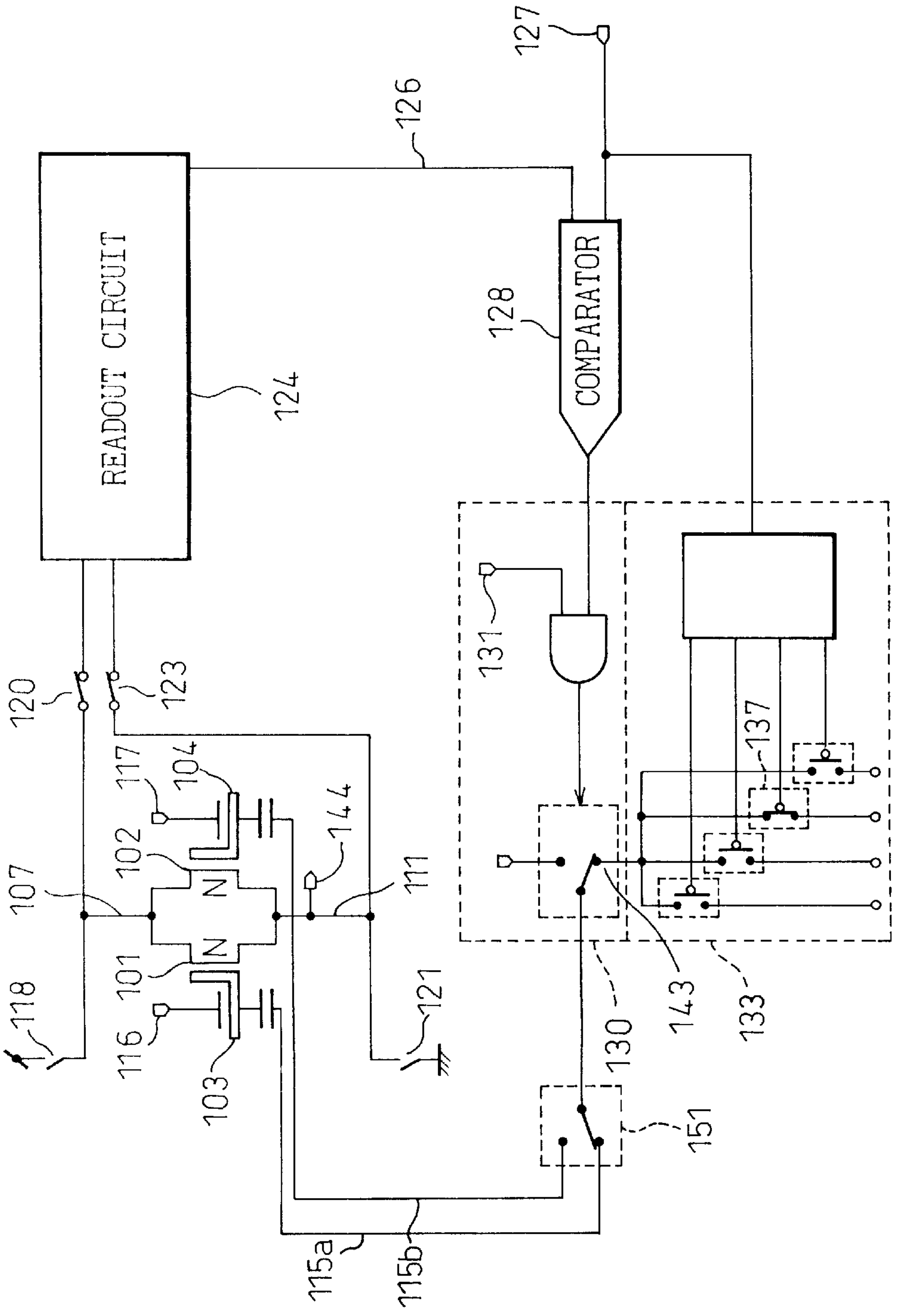
FIG. 6 is a diagram showing the states of the computing cell and write control circuit of the first embodiment in a write mode.
Figure 7:
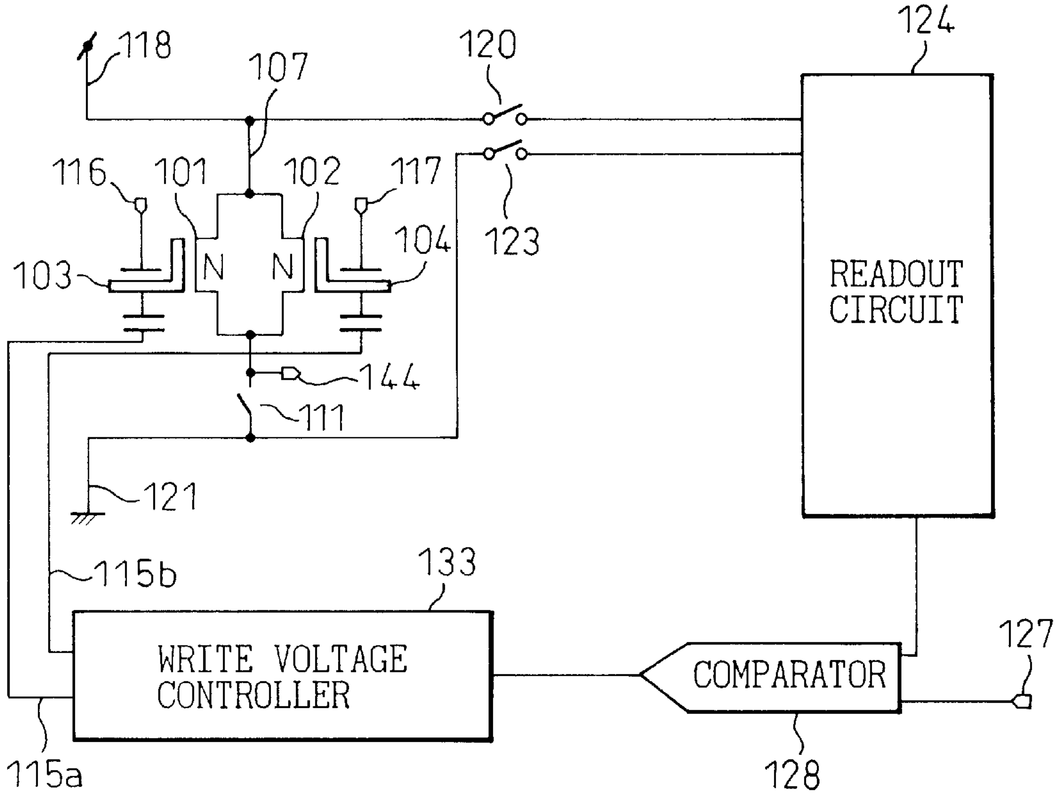
FIG. 7 is a diagram showing the states of the computing cell and write control circuit of the first embodiment in a computing mode.

First, the configuration and operation of the computing cell and the write control circuit according to one embodiment of the invention will be described with reference to FIGS. 5 to 7.

Figure 5:
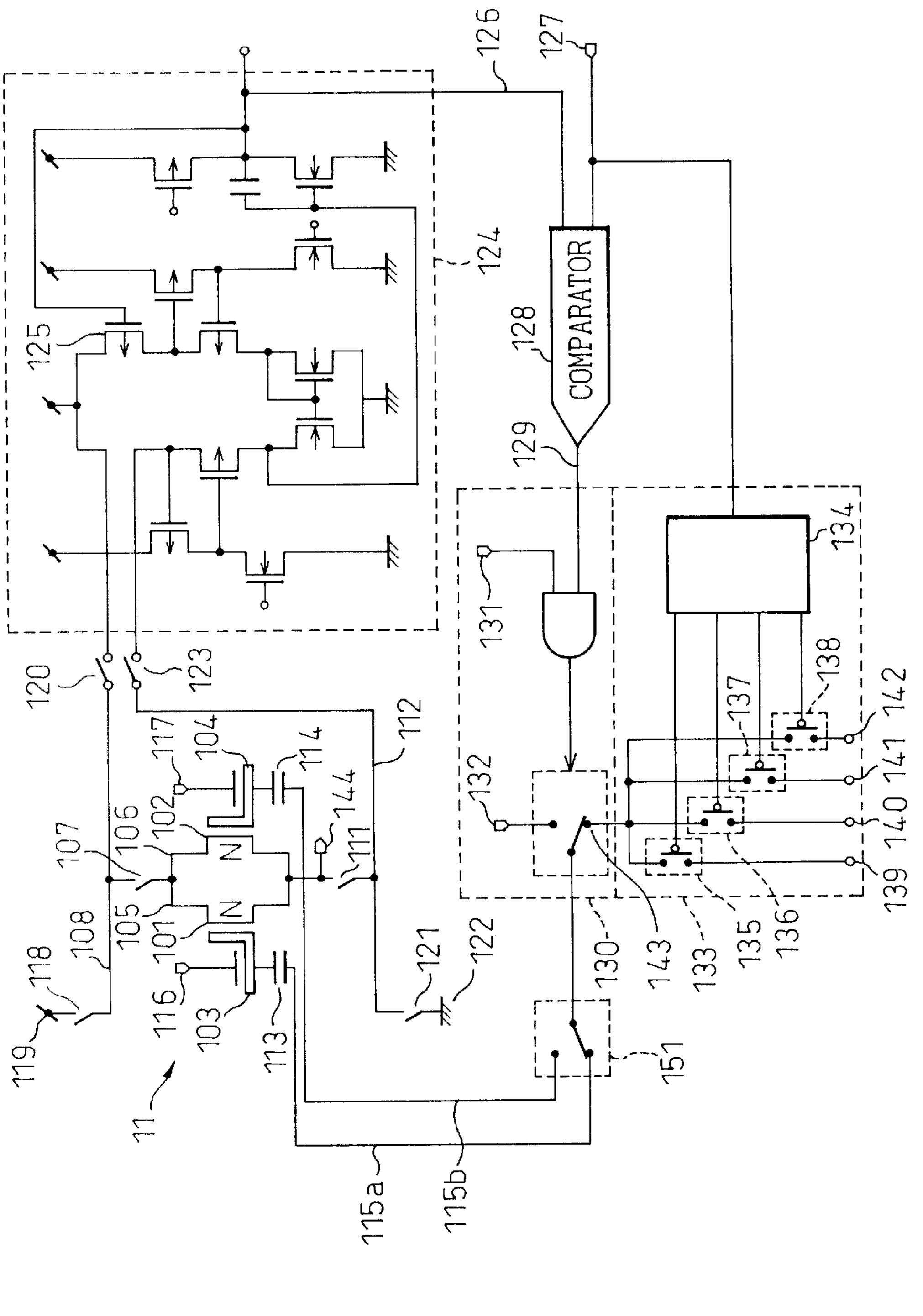
FIG. 5 is a circuit diagram showing the configuration of a computing cell and a write control circuit according to a first embodiment.

FIG. 5 is a circuit diagram showing the computing cell 11 and the write control circuit 22. Only one computing cell is shown here. A readout circuit 124, a comparator 128, a write voltage control circuit 133, a write voltage selector circuit 130, and a write selector circuit 151 together constitute the write control circuit 22.

Reference numerals 101 and 102 indicate the NMOS transistors, and 103 and 104 designate floating gates formed, for example, from n+ polysilicon; the floating gate 103 controls the on/off state of the NMOS transistor 101, while the floating gate 104 controls the on/off state of the NMOS transistor 102. The drain electrodes 105 and 106 of the NMOS transistors 101 and 102 are coupled together and connected to a signal line 108 via a switch device 107 formed from a PMOS transistor. On the other hand, the source electrodes 109 and 110 of the NMOS transistors 101 and 102 are coupled together and connected to a signal line 112 via a switch device 111 formed from an NMOS transistor. In the present embodiment, the switch devices 107 and 111 are formed from a PMOS transistor and an NMOS transistor, respectively, but it will be appreciated that any device may be used as long as it has the function of a switching device.

The floating gate 103 of the NMOS transistor 101 is, on one side, capacitively coupled to the control gate 116 and, on the other side, connected to a charge injection and removal means 113. The means 113 is connected to an output terminal 115*a* of the write selector circuit as well as to the floating gate 103. Similarly, the floating gate 104 of the NMOS transistor 102 is, on one side, capacitively coupled to the control gate 117 and, on the other side, connected to a charge injection and removal means 114. The means 114 is connected to an output terminal 115*b* of the write selector circuit as well as to the floating gate 104. That is, the floating gates 103 and 104 are connected to the output terminals 115*a* and 115*b* of the write selector circuit via thin tunnel oxide films, respectively. The charge injection and removal means 113 and 114 respectively take high voltages from the output terminals 115*a* and 115*b*, apply the high voltages between the floating gates 103, 104 and the output terminals 115*a*, 115*b* (i.e., across the respective tunnel oxide films), and inject charges into or remove charges from the respective floating gates 103 and 104 utilizing the Fowler-Nordheim current.

The tunnel oxide films may be replaced by nitride films or oxide/nitride films (ONO films), and charge injection and removal may be performed utilizing the Frankel-Poole emission current. Alternatively, each of the means 113 and 114 may be constructed from a MOS transistor having a floating gate which is connected to the corresponding floating gate 103 or 104, the source or drain electrode of this transistor being connected to the corresponding output terminal 115*a* or 115*b* of the write selector circuit and the other electrode connected to ground potential or a prescribed potential, and charge injection and removal may be performed utilizing the channel-hot-electron current.

In the illustrated example, the signal line 108 is connected to a 5-V power supply line 119 via a switch device 118 formed from a PMOS transistor, and also to a designated terminal of the readout circuit 124 via a switch device 120 formed from a CMOS transmission gate. Similarly, the signal line 112 is connected to a 0-V power supply line 122 via a switch device 121 formed from an NMOS transistor, and also to a designated terminal of the readout circuit 124 via a switch device 123 formed from a CMOS transmission gate.

As shown, a MOS transistor 125 in the readout circuit 124 is paired with the MOS transistor 101 in the computing cell, and the readout circuit 124, in combination with the MOS transistor 101, reads out the voltage on the floating gate 103 of the MOS transistor 101 utilizing the op amp voltage follower operation, and outputs the readout voltage value onto an output terminal 126. The MOS transistor 125 in the readout circuit 124 is also paired with the MOS transistor 102 in the computing cell, and the readout circuit 124, in combination with the MOS transistor 102, reads out the voltage on the floating gate 104 of the MOS transistor 102 utilizing the op amp voltage follower operation, and outputs the readout voltage value to the output terminal 126. In the illustrated example, the value of the voltage on each of the floating gates 103 and 104 is read out utilizing the op amp voltage follower operation, but the readout circuit may be constructed by connecting the signal line 108 or 112 to the output terminal 126 so as to read out the voltage value utilizing the transistor source follower operation; in this case also, the voltage can be read out without any problem.

The output terminal 126 of the readout circuit 124 and an external input terminal 127 are connected to input terminals of the comparator 128. An output terminal 129 of the comparator 128 is connected to the write voltage selector circuit 130.

The comparator 128 takes as inputs the voltages from the output terminal 126 of the readout circuit 124 and termination signal at its output terminal 129 when the voltage on the output terminal 126, read out by the readout circuit 124 at the time of writing to the floating gate 103 or 104, becomes equal to the voltage on the external input terminal 127.

The write voltage selector circuit 130 selects either an output terminal 143 of the write voltage control circuit 133 or a terminal 132 at which ground potential or a voltage equal to one-half the voltage of the output terminal 143, for example, is input; more specifically, when control voltages on the terminals 129 and 131 are both "1", the output terminal 143 of the write voltage control circuit 133 is selected for connection to the output terminal of the write voltage selector circuit 130, otherwise the voltage on the terminal 132 is selected for output onto the output terminal 115. The write selector circuit 151 directs the output of the write voltage selector circuit 130 to one or the other of the output terminals 115*a* and 115*b*, that is, selects which of the floating gate 103 or 104 the voltage should be written to.

The write voltage control circuit 133 is configured so that the voltage to be output on the output terminal 143 can be varied in steps, and the voltage to be output on the output terminal 143 is varied in accordance with the voltage to be written. For example, the analog voltage applied at the external signal input terminal 127 is converted by a 2-bit A/D converter 134 into digital form, and only one of switch devices 135, 136, 137, and 138 is caused to conduct. Suppose, for example, that the target value of the voltage to be written to the floating gate 103 or 104 takes a value ranging from 0.5 V to 4.5 V; then, when the voltage value on the external signal input terminal 127 is within a range of 0.5 V to 1.5 V, the switch device 135 is caused to conduct so that an input voltage at a terminal 139 is output on the output terminal 143. Likewise, when the voltage value on the external signal input terminal 127 is within a range of 1.5 V to 2.5 V, the switch device 136 is caused to conduct so that an input voltage at a terminal 140 is output on the output terminal 143. Similarly, when the voltage value on the external signal input terminal 127 is within a range of 2.5 V to 3.5 V, an input voltage at a terminal 141 is selected, and when the voltage value on the external signal input terminal 127 is within a range of 3.5 V to 4.5 V, an input voltage at a terminal 142 is selected for output on the output terminal 143 of the write voltage control circuit 133. In this way, the target value of the voltage to be written to the floating gate 103 or 104, that is, the write voltage determined in accordance with a predetermined rule based on the value of the input voltage at the external signal input terminal 127, is output on the output terminal 143 of the write voltage control circuit 133. The circuit shown here is configured to select one of the voltages input at the terminals 139 to 142 in accordance with the voltage input at the external signal input terminal 127; alternatively, the external signal input terminal 127 may be taken as an input to the write voltage control circuit, eliminating the input terminals 140, 141, and 142, and the voltage input from the external signal input terminal 127 may be added to the input voltage at the terminal 139 to output the sum voltage on the output terminal 143. It is also possible to construct the write voltage control circuit from a circuit that has a predefined input/output characteristic relationship between the voltage input from the external signal input terminal 127 and the voltage output at the output terminal 143 such that the output voltage is expressed as a function of the input voltage, for example, the value obtained by adding +15.0 V to the square root of the input voltage from the terminal 127 is equal to the output voltage delivered at the terminal 143.

Though not shown here, each switch device is controlled by the gate control circuit 21 in FIG. 4.

In the present embodiment, as an example, it is assumed that the template data is set as 3 V and the input data as 2 V. In this case, the result of the computation in the semiconductor computing circuit of the present embodiment shows the absolute difference between the template data and the input data, i.e., 3 V−2 V=1 V. A detailed operational description will be given below by dividing the operation into two modes, a write mode for writing the template data and a computing mode for performing computation with the input data after writing.

First, the write mode will be described. In the present embodiment, the template data is set as 3 V, and 3 V is written to the floating gate 103 of the NMOS transistor 101, while 5−3=2 V is written to the floating gate 104 of the NMOS transistor 102. That is, when the template data is denoted as $V_M$, $V_M$ is written to one floating gate and $V_{DD}-V_M$ to the other floating gate.

In the write mode, the switches 12-a to 12-p and 13-a to 13-p in FIG. 4 are set so that signals from the gate control circuit 21 are applied to the respective control gates. Further, as shown in FIG. 6, the switch devices 107, 111, 120, and 123 are turned on and the switch devices 118 and 121 are turned off. A voltage of 3 V, the same value as the voltage to be written to the floating gate, is taken as the target voltage and is input at the external signal input terminal 127 of the comparator 128. In the illustrated example, since the voltage on the external signal input terminal 127 is set to 3 V, in the write voltage control circuit 133 only the switch device 137 is turned on so that the voltage at the terminal 141 is output on the output terminal 143.

First, to write 3 V to the floating gate 103, the write selector circuit 151 is set so that the output of the write voltage selector circuit 130 is connected to the output terminal 115*a*. Then, from the gate control circuit 21 in FIG. 4, a predetermined constant voltage, for example, a voltage of 5 V, is applied to the control gate 116 of the floating gate 103 of the NMOS transistor 101, while a low enough voltage is applied to the control gate 117 of the NMOS transistor 102 as well as to the control gates of the other computing cells 11-b to 11-p so that no writing or reading is performed on their associated floating gates. In this condition, the terminal 131 of the write voltage control selector circuit 130 is set to "1"; then, if the voltage on the output terminal 126 of the readout circuit 124 is not identical with the voltage (3 V) on the external signal input terminal 127, the comparator 128 outputs "0" at its output terminal 129, as a result of which the write voltage at the output terminal 143 of the write voltage control circuit 133 is output on the output terminal of the write voltage selector circuit 130 and applied to the charge injection and removal means 113, thus starting the write operation to the floating gate 103. At this time, since no voltage is applied to the charge injection and removal means 114 connected to the floating gate 104, no writing is performed to the floating gate 104. During this write operation, the voltage value on the floating gate 103 is constantly read out by the readout circuit 124, and the readout value is output to the output terminal 126. Since a voltage low enough to not cause reading is applied to the control gate 117 of the floating gate 104, as described above, the readout circuit 124 reads the voltage value only on the floating gate 103. When the voltage on the terminal 126 becomes equal to the voltage value on the external signal input terminal 127, the comparator 128 outputs "1" as a write termination signal at its output terminal 129, causing the output voltage on the terminal 115 to switch from the write voltage at the terminal 143 to the write termination voltage at the terminal 132 and thereby terminating the write operation to the floating gate 103.

After writing to the floating gate 103 of the NMOS transistor 101 is completed, writing is performed in a similar manner to the floating gate 104 of the NMOS transistor 102. Further, writing is performed in the same manner, in sequence, to the floating gates of the other 15 computing cells 11-b to 11-p shown in FIG. 4. In all the pattern distance computing circuits 1-1 to 1-n shown in FIG. 3, writing is performed in accordance with the corresponding pattern template data.

As described above, according to the present embodiment, analog/multi-valued write target values can be written using the write voltages determined based on the four kinds of voltage values. Furthermore, according to the present embodiment, since writing to the floating gate to be used for computation is performed using the write voltage determined based on the write target voltage applied to the external signal input terminal 127, the write time from the start to the end of the write operation can be shortened and can be equalized to a certain extent.

In writing the template data, if the writing is performed while reading out by the readout circuit, and the end of the write operation is detected using the readout voltage, there occurs a time delay from the time the voltage on the floating gate reaches the write target value until the time the writing is actually terminated, and any value written during this delay time causes an error. In the present embodiment, by supplying the optimum write voltage based on the write target voltage, the write time is equalized to a certain extent and variations in write speed causing a write error immediately before the end of the write operation are held to within a predefined range. This accomplishes high-accuracy writing.

As described above, in the present embodiment, the write voltage is varied in steps according to the write target value in order to increase the write speed and reduce the variations in write speed due to the write target value, but it will be recognized that the write voltage may be maintained constant regardless of the write target voltage.

Furthermore, in the present embodiment, at the same time that the voltage is written to the gate electrode for computing, the voltage value is read out to determine whether or not the voltage has reached the write target value, but this is only one example, and instead, the widely practiced write/verify method can be employed.

Since the voltage written to the floating gate is retained semipermanently, there is no need to rewrite the voltage to the floating gate as long as the template data is not changed. Accordingly, the write circuit 22 may be provided in a separate write apparatus; in that case, a device containing circuitry other than the write circuit 22 can be used as the computing apparatus after writing the desired template data to the device by using the write apparatus. The circuit size can then be reduced because the write circuit 22 can be omitted from the device.

Next, the computing mode will be described. In the write mode, for the template data of 3 V, 3 V has been written to the floating gate 103 of the NMOS transistor 101 and 2 V to the floating gate 104 of the NMOS transistor 102. In the computing mode, the switches 12-a to 12-p in FIG. 4 are set so that the outputs of the difference voltage generating circuit 14-a to 14-p are applied to the corresponding control gates, and the switches 13-a to 13-p are set so that signals (input data) Sa to Sp are applied to the corresponding control gates. Further, the switch devices 107, 118, and 121 are turned on and the switches 111, 120, and 123 are turned off, as shown in FIG. 7; in this condition, the absolute difference between the template data and the input data is computed.

The difference voltage generating circuits 14-a to 14-p in FIG. 4 compute the differences between the supply voltage $V_{DD}$ and the respective signals (input data) Sa to Sp, and output the results. The following description is given based on the premise that 2 V is supplied as the input data. 5−2=3 V, output from the difference voltage generating circuit 14, is applied to the control gate 116 of the NMOS transistor 101, while the input data 2 V is applied to the control gate 117 of the NMOS transistor 102. At this time, as shown in FIG. 7, the potential at the floating gate 103 of the NMOS transistor 101 drops from 3 V by 2 V to 1 V as the potential of the control gate 116 during writing is lowered from 5 V to 3 V. That is, denoting the template data as $V_M$ and the input data as $V_X$, the voltage written to the floating gate 103 when $V_{DD}$ is applied to the control gate 116 is $V_M$, and when the potential at the control gate 116 is lowered from $V_{DD}$ to $V_{DD}-V_X$ at the time of computation, the potential at the floating gate 103 drops by $V_X$; hence, the potential at the floating gate 103 decreases to $V_M-V_X$. In this way, the difference between the template data and the input data can be computed on the floating gate.

On the other hand, since 5−3=2 V is written to the floating gate 104 of the NMOS transistors 102, when 2 V is applied to the control gate 117 the potential at the floating gate 104 drops from 2 V by 3 V to −1 V as the potential of the control gate 117 is lowered from 5 V to 2 V. That is, for the template data $V_M$ and the input data $V_X$, the voltage written to the floating gate 104 when $V_{DD}$ is applied to the control gate 117 is $V_{DD}-V_M$, and when the potential at the control gate 117 is lowered from $V_{DD}$ to $V_X$ at the time of computation, the potential at the floating gate 104 drops by $V_{DD}-V_X$; hence, the potential at the floating gate 104 decreases to $V_X-V_M$.

In this way, $V_M-V_X$ is computed on the floating gate 103 of the NMOS transistor 101, while $V_{X-VM}$ is computed on the floating gate 104 of the NMOS transistor 102. After the potentials on the respective floating gates have been determined, when the NMOS transistors 101 and 102 whose source electrodes are connected together are operated in a source follower configuration, the potential at the output terminal 144 rises in such a manner as to follow the floating gate whose potential value is larger. As a result, the final potential at the output terminal 144 is expressed by Max $(V_X-V_M, V_M-V_X)=|V_X-V_M|$. That is, when reading the potentials written to the floating gates 103 and 104, by applying the input data to the respective control gates 116 and 117, the differences relative to the input data are computed on the respective floating gates and, by reading the respective values utilizing the source follower operation, the absolute difference between the template data and the input data is computed and the result is output from the terminal 144.

Turning back to FIG. 4, the summing circuit 15 comprises: 16 first electrodes 17-a to 17-p connected to the terminals 144 of the respective computing cells 11-a to 11-p; a second electrode 18 as a floating gate; a switch device 19; and a source follower circuit 20 having the second electrode 18 as its gate electrode. The 16 first electrodes 17-a to 17-p and the second electrode 18 form a capacitor. In other words, the first electrodes 17-a to 17-p are respectively the first electrodes of 16 capacitors, and the second electrodes of the 16 capacitors are connected together. In the write mode, the switch device 19 is set on to connect the second electrode 18 to ground level. In the computing mode, the switch device 19 is turned off, and the absolute differences between the template data and the input data are output from the respective computing cells 11-a to 11-p. The potential at the second electrode 18 increases proportionally to the voltage signals indicating the absolute differences output from the respective computing cells 11-a to 11-p; the value of the potential corresponds to the sum of the absolute differences output from the respective computing cells 11-a to 11-p. The source follower circuit 20 outputs a voltage signal corresponding the sum of the absolute differences.

As described above, in the computing mode, each of the pattern distance computing circuits 1-1 to 1-n outputs the Manhattan distance between the template data of the corresponding pattern stored in the code book 100 and the image signal, and the smallest signal detection circuit 2 searches for the pattern having the smallest distance and outputs a code indicating that pattern. In this way, the pattern that most closely resembles the one unit of the image signal is determined.

In the present embodiment, the write control circuit 22 for varying the amount of charge on the floating gate is implemented using the readout circuit, comparator, write voltage control circuit, write voltage selector circuit, and write selector circuit, but any other means may be used as long as the means is capable of varying the amount of charge on the floating gate; in that case also, the effect of the present invention can be achieved.

As described above, using a very small number of transistors, the invention achieves an apparatus that functions as a nonvolatile analog/multi-valued memory for storing template data and that computes the Manhattan distance, i.e., the absolute difference between the stored data (template data) and the input data, and detects the pattern having the smallest distance.

The first embodiment described above has dealt with an example of a semiconductor computing circuit, i.e., a computing cell capable of obtaining the absolute difference ($|V_X-V_M|$) between the template data ($V_M$) and the input data ($V_X$), but in a practical implementation, there occurs the problem that the actually obtained voltage value differs from the ideal value because of the ratio of transistor gate capacitance to floating gate to control gate coupling capacitance. The second embodiment hereinafter described concerns a semiconductor computing circuit that overcomes this problem.

Figure 8:
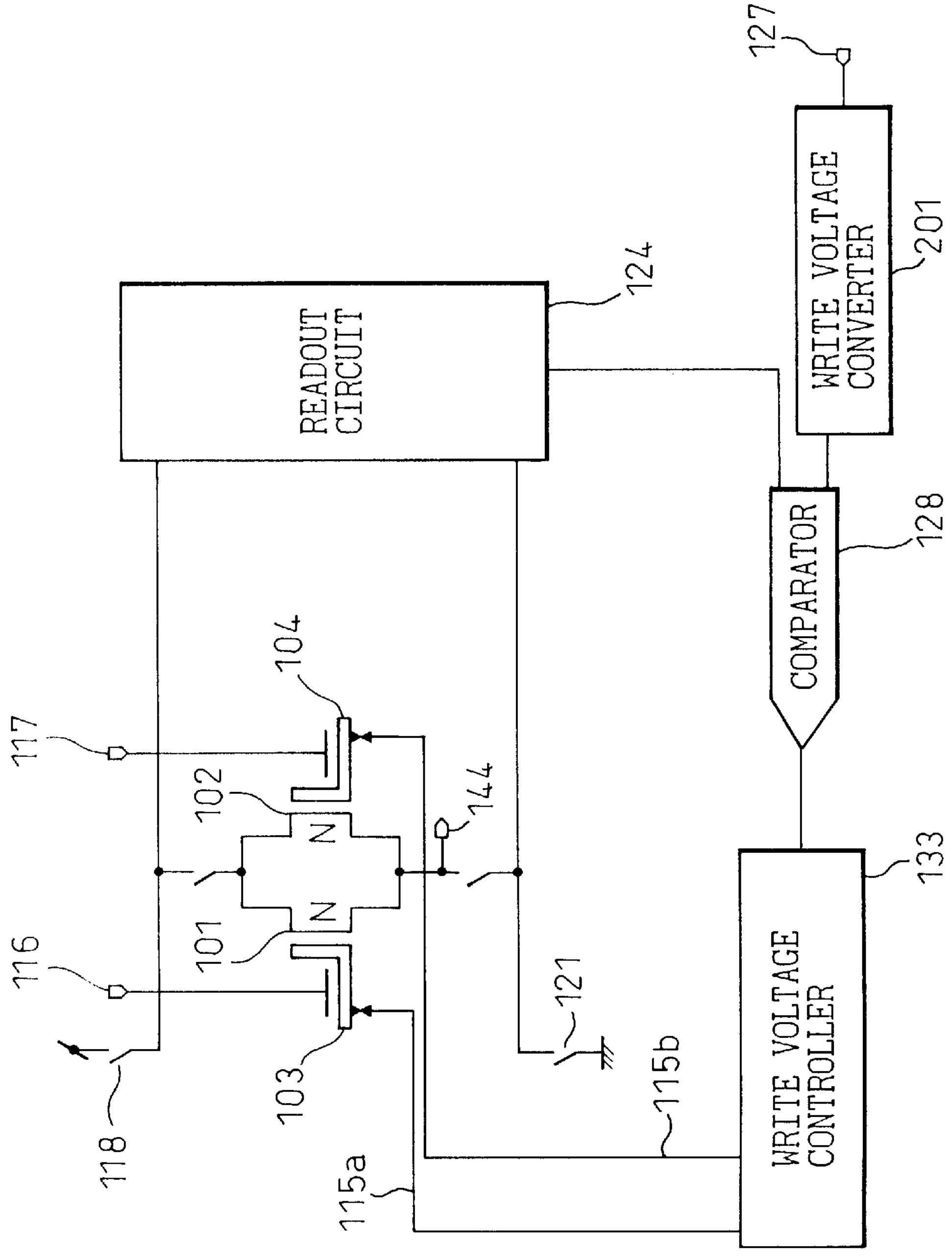
FIG. 8 is a diagram showing the configuration of a semiconductor computing circuit (computing cell) and a write control circuit according to a second embodiment of the present invention.

FIG. 8 is a diagram showing the configuration of the computing circuit according to the second embodiment of the present invention; the diagram shown corresponds to FIG. 5.

The reason for not being able to obtain the ideal result and the configuration of the second embodiment that solves the problem will be described below. Since the basic circuit configuration and circuit operation of the computing circuit of the second embodiment are the same as those of the computing cell of the first embodiment, the following description deals only with differences from the first embodiment.

Here, the transistor gate capacitance is denoted by $C_0$ and the floating gate to control gate coupling capacitance by $C_1$. After writing $V_M$ and $V_{DD}-V_M$ to the floating gates of the respective transistors where $V_M$ is the template data, when $V_{DD}-V_X$ and $V_X$ are applied to the respective control gates where $V_X$ is the input data, potentials $V_{F1}$ and $V_{F2}$ at the respective floating gates are given as $$V_{F1} = V_M - \frac{C_1}{C_1 + C_0}\{V_{DD} - (V_{DD} - V_M)\}$$
$$= V_M - \frac{C_1}{C_1 + C_0}V_X = V_M - \gamma V_X$$
$$V_{F2} = (V_{DD} - V_M) - \frac{C_1}{C_1 + C_0}(V_{DD} - V_X)$$
$$= (1-\gamma)V_{DD} + \gamma V_X - V_M$$
$$\text{wherein } \gamma = \frac{C_1}{C_1 + C_0}$$

As shown, the voltage applied as the input data to each control gate is multiplied by a positive constant γ smaller than 1; this disrupts the symmetry between the floating gate potentials of the paired transistors, and high-accuracy computation results cannot be obtained.

This problem can be solved by converting the write voltage to $\gamma V_M$ for the floating gate 103 and to $\gamma(V_{DD}-V_X)$ for the floating gate 104 when writing the template data $V_M$ to the floating gates. In view of this, in the computing circuit of the second embodiment, a write voltage converter 201 using, for example, an operational amplifier is provided as a means for converting the write voltage, and when the template data $V_M$ is externally applied, the value multiplied by γ is automatically output. As a result, the template data $V_M$ externally applied at the external signal input terminal 127, multiplied by γ, is applied as the voltage to be written to the floating gates 103 and 104 of the NMOS transistors 101 and 102. It will, however, be appreciated that the write voltage control configuration is not specifically limited to the one shown here, but any suitable configuration may be used.

After writing the thus set write voltages to the respective floating gates, when, for the input data $V_X$, $V_{DD}-V_X$ and $V_X$ are applied to the respective control gates 116 and 117, the potentials $V_{F1}$ and $V_{F2}$ at the respective floating gates are expressed as $$V_{F1}=V_M\gamma V_M-\gamma\{V_{DD}-(V_{DD}-V_X)\}=\gamma(V_M-V_X)$$

$$V_{F2}=\gamma(V_{DD}-V_M)-\gamma(V_{DD}-V_X)=\gamma(V_X-V_M)$$

As shown, the symmetry between the potentials of the two floating gates is maintained; in this condition, when the transistors 101 and 102 are operated in a source follower configuration, the potential $V_{F1}$ or $V_{F2}$, whichever is larger in voltage value, i.e., $\mathrm{Max}(\gamma(V_X-V_M), \gamma(V_M-V_X))$, appears at the output terminal 144.

Figure 9:
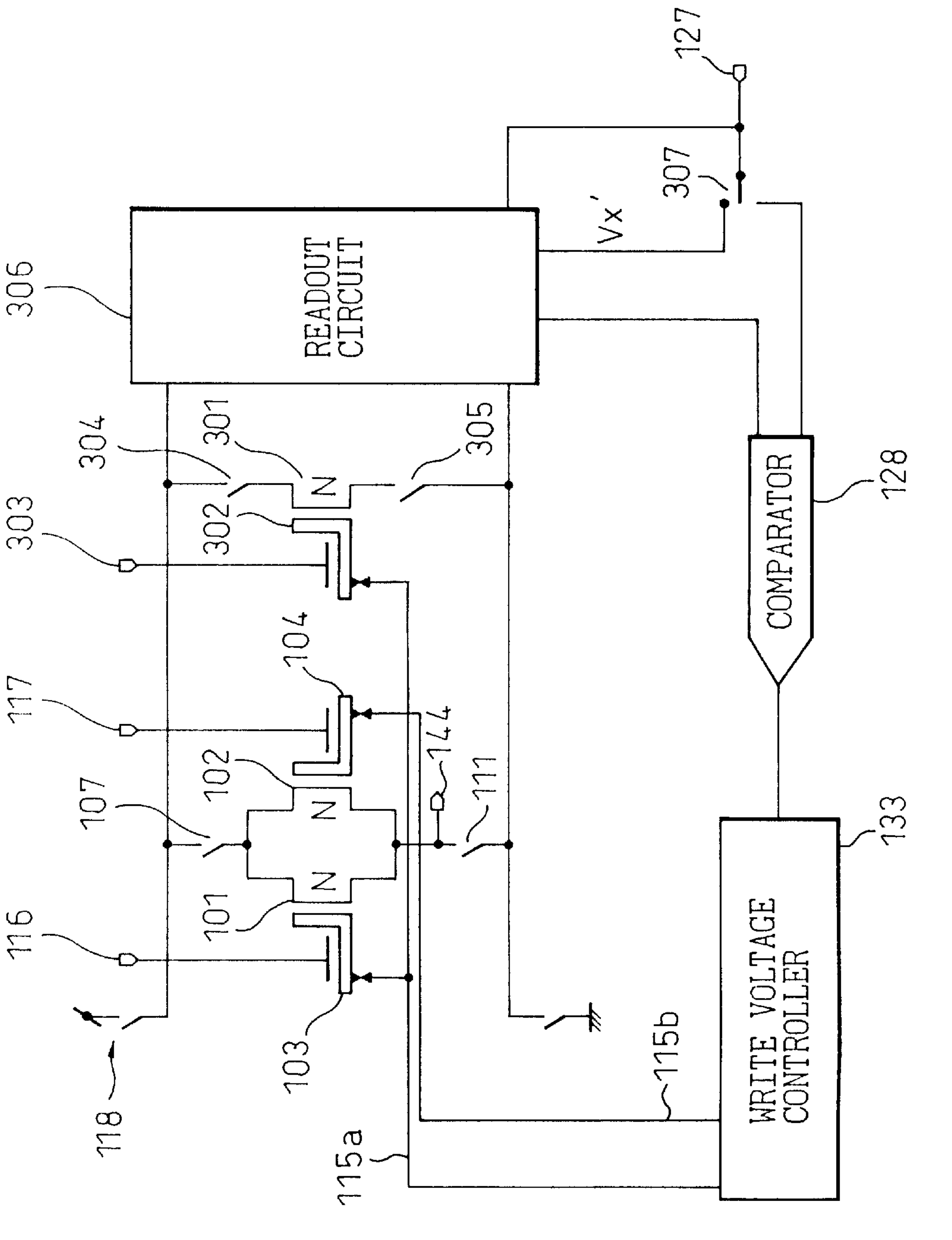
FIG. 9 is a diagram showing the configuration of a semiconductor computing circuit (computing cell) and a write control circuit according to a third embodiment of the present invention.

FIG. 9 is a diagram showing the configuration of a computing circuit according to a third embodiment of the present invention.

The third embodiment uses a different method from that of the second embodiment to solve the problem that the actually obtained voltage value differs from the ideal value because of the ratio of transistor gate capacitance to floating gate to control gate coupling capacitance. Since the basic circuit configuration and circuit operation of the third embodiment are the same as those of the first embodiment, the following description deals only with differences from the first embodiment.

Transistor 301 is a dummy transistor and is exactly the same in structure as each of the transistors 101 and 102. It is assumed here that the template data $V_X$ is written to the floating gate 103 of the transistor 101 and $V_{DD}-V_X$ is written to the floating gate 104 of the transistor 102. First, 0 V is applied to the control gate 303 of the dummy transistor 301. At this time, the amount of charge held on a floating gate 302 is read as voltage $V_0$ and held in a readout circuit 306. Next, $V_X$ is applied to the control gate 303 of the dummy transistor 301. The voltage to be applied to the control gate 303 is output, for example, from the readout circuit 306. $V_X$ to be applied to the control gate 303 is supplied from the external signal input terminal 127 to the readout circuit 306. At this time, the difference $V_X'$ relative to the value of the voltage held on the floating gate 302 is computed and output. The voltage $V_X'$ output from the readout circuit 306 at this time is expressed by the following equation in relation to the write voltage target value $V_X$ applied to the control gate 303.

$$V_X' = (V_1 - V_0) = \left\{\left(\frac{C_1}{C_1 + C_0}V_X + V_0\right) - V_0\right\} = \gamma V_X$$

This $V_X'$ is taken as the new write target voltage, and writing to the floating gate 103 of the transistor 101 is performed by turning the switch devices 305 and 304 off and the switch devices 111, 107, and 307 on. With this series of operations, the value considering the gate capacitance to coupling capacitance ratio can actually be written to the floating gate when writing the template data $V_X$. A similar series of operations can be used when writing $V_{DD}-V_X$ to the floating gate 104.

In the second and third embodiments, the write voltages to be applied to the floating gates 103 and 104 of the transistors 101 and 102 are corrected by multiplying them by the coupling capacitance ratio, but it will be noted that the correction can also be accomplished if the voltages to be applied to the control gates 116 and 117 are divided by the coupling capacitance ratio γ, rather than correcting the write voltages to be applied to the floating gates 103 and 104. More specifically, in the first embodiment, in the write mode $V_{DD}/\gamma$ is applied to the control gates 116 and 117, and in the computing mode, $(V_{DD}-V_X)/\gamma$ is applied to the control gate 116 and $V_X/\gamma$ to the control gate 117.

Figure 10:
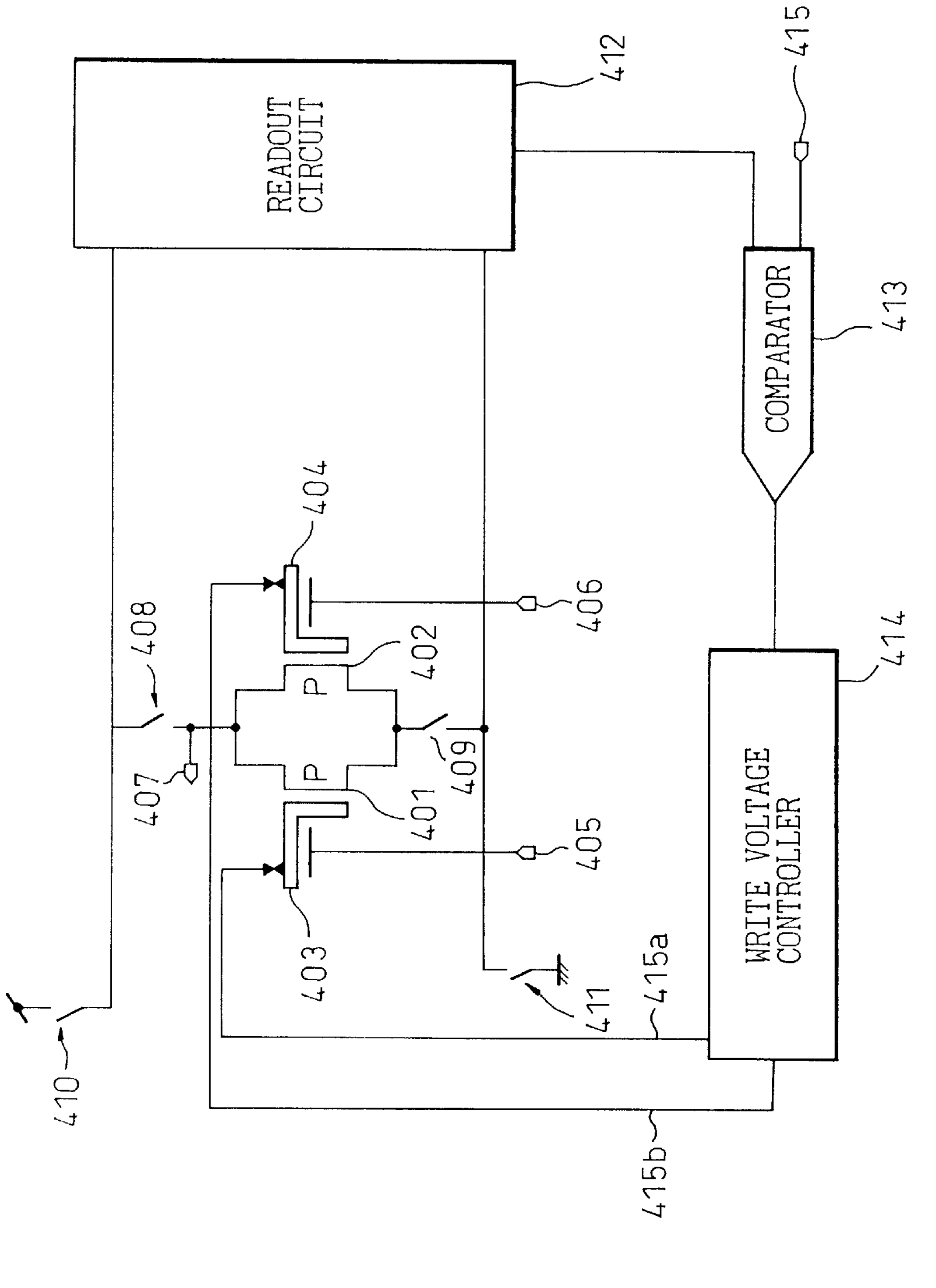
FIG. 10 is a diagram showing the configuration of a fourth embodiment of the present invention in which each computing cell is constructed using PMOS transistors.

The above embodiments have dealt with examples in which each computing cell is constructed using NMOS transistors, but it will be appreciated that each computing cell can be constructed using PMOS transistors. FIG. 10 is a diagram showing a fourth embodiment in which each computing cell is constructed using PMOS transistors. The source electrodes and drain electrodes of two PMOS transistors 401 and 402 are respectively connected together, and the source electrodes together are connected to the summing circuit and also to a signal line via a switch device 408; this signal line is connected to a readout circuit 412 and also to the power supply line via a switch device 410. On the other hand, the drain electrodes together are connected to a signal line via a switch 409, and this signal line is connected to the readout circuit 412 and also to ground potential via a switch device 411. Floating gates 403 and 404 of the PMOS transistors 401 and 402 are, on one side, connected to a write voltage controller 414 and, on the other side, are capacitively coupled to control gates 405 and 406, respectively. As in the first embodiment, a voltage is written to the floating gate 403 or 404 by using the write voltage controller 414 while, at the same time, reading out the voltage on the floating gate 403 or 404 by using the readout circuit 412. A comparator 413 compares the voltage on the floating gate 403 or 404, read out by the readout circuit 412, with the target voltage input from the external signal input terminal 415, and outputs a termination signal when the voltage on the floating gate 403 or 404 has reached the target voltage.

Figure 11:
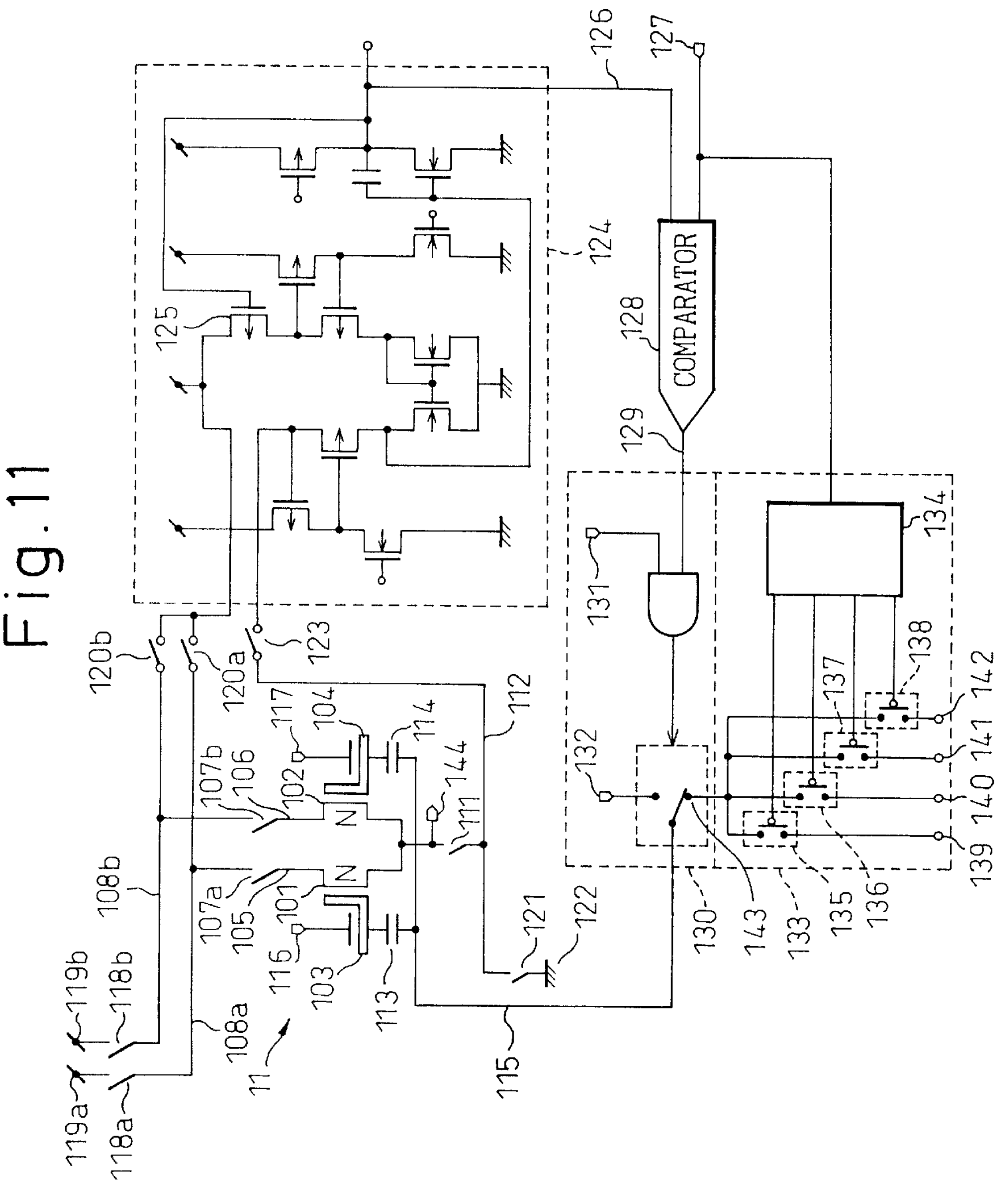
FIG. 11 is a diagram showing the configuration of a fourth embodiment of the present invention in which the drain electrodes of the computing cell are separated and writing means are connected together.

In the first to fourth embodiments, the drains of each computing cell, as well as the sources thereof, are connected together, but the drains need not necessarily be connected together, and the drains may be individually connected to the power supply line and the readout circuit. FIG. 11 is a diagram showing a fifth embodiment in which the drains are individually connected to the power supply line and the readout circuit.

As shown, the fifth embodiment is similar in configuration to the first embodiment shown in FIG. 5, the only differences being in the connections of the drains of the computing cell and the connections of the charge injection and removal means 113 and 114 associated with the floating gates 103 and 104. The drain electrode 105 of the NMOS transistor 101 is connected to a signal line **108*a* via a switch device 107*a* formed from a PMOS transistor. The drain electrode 106 of the NMOS transistor 102 is connected to a signal line 108*b* via a switch device 107*b* formed from a PMOS transistor. The signal lines 108*a* and 108*b* are connected via switch devices 118*a* and 118*b* to power supply lines 119*a* and 119*b*, respectively, and via switch devices 120*a* and 120*b* to the readout circuit 124. On the other hand, the charge injection and removal means 113 and 114 are connected to a common terminal 115**.

When writing to the floating gate 103, the switch devices **107*a* and 120*a* are turned on, while the switch devices 107*b*, 120*b*, 118*a*, and 118*b* are turned off. As a result, only the NMOS transistor 101 is connected to the readout circuit 124, and the NMOS transistor 102 is not connected so that, even if the NMOS transistor 102 is on, this transistor will have no effect on the write operation. Therefore, a high voltage can be applied to the control gate 117 of the NMOS transistor 102. As a result, when a high voltage is applied to the terminal 115 to write to the floating gate 103, no writing is done to the floating gate 104. Otherwise, the operation is the same as that of the first embodiment. when writing to the floating gate 104 after completing the write operation to the floating gate 103, only the NMOS transistor 102 is connected to the readout circuit 124, and the same process is repeated. When performing computation, the switch devices 107*a*, 107*b*, 118*a*, and 118*b* are turned on, and the switch devices 120*a* and 120*b* are turned off. Since the subtraction operation is performed on the common source side, the same operation as in the first embodiment is performed even if the drain electrodes 105 and 106 are individually connected to the respective power supply lines 119*a* and 119*b***.

As described above, according to the present invention, a computing circuit capable of storing analog or multi-valued data at high speed and high accuracy and capable of performing analog or multi-valued computations with high accuracy can be achieved with simple circuitry.

We claim:

1. A semiconductor computing circuit for computing an absolute-value voltage representing the difference between a first signal voltage and a second signal voltage, comprising:

a first MOS transistor having a floating gate and a control gate capacitively coupled to said floating gate;

a second MOS transistor having a floating gate and a control gate capacitively coupled to said floating gate, and whose source electrode is connected to the source electrode of said first MOS transistor;

a write circuit which, with a prescribed voltage applied to said control gates of said first and second MOS transistors, sets the potential at said floating gate of said first MOS transistor to a value equal to said first signal voltage and also sets the potential at said floating gate of said second MOS transistor equal to a value obtained by subtracting said first signal voltage from said prescribed voltage; and a difference voltage computing circuit for computing a voltage representing a value obtained by subtracting said second signal voltage from said prescribed voltage, and wherein:

after setting said first and second MOS transistors by said write circuit, when the output voltage of said difference voltage computing circuit is applied to said control gate of said first MOS transistor while at the same time applying said second signal voltage to said control gate of said second MOS transistor, said absolute-value voltage representing the difference between said first signal voltage and said second signal voltage is output.

2. A semiconductor computing circuit as claimed in claim 1, wherein said first and second MOS transistors are N-channel MOS transistors, and said prescribed voltage is a high-level supply voltage.

3. A semiconductor computing circuit as claimed in claim 1, wherein said first and second MOS transistors are P-channel MOS transistors, and said prescribed voltage is a low-level supply voltage.

4. A semiconductor computing circuit for computing an absolute-value voltage representing the difference between a first signal voltage and a second signal voltage, comprising:

a first MOS transistor having a floating gate and a control gate capacitively coupled to said floating gate;

a second MOS transistor having a floating ate and a control gate capacitively coupled to said floating gate, and whose source electrode is connected to the source electrode of said first MOS transistor;

a write circuit which, with a prescribed voltage applied to said control gates of said first and second MOS transistors, sets the potential at said floating gate of said first MOS transistor to a value equal to said first signal voltage multiplied by a positive constant $\gamma$ smaller than 1 and also sets the potential at said floating gate of said second MOS transistor equal to a value obtained by subtracting said first signal voltage from said prescribed voltage and multiplying the resulting difference by said constant $\gamma$; and a difference voltage computing circuit for computing a voltage representing a value obtained by subtracting said second signal voltage from said prescribed voltage, and wherein:

after setting said first and second MOS transistors by said write circuit, when the output voltage of said difference voltage computing circuit is applied to said control gate of said first MOS transistor while at the same time applying said second signal voltage to said control gate of said second MOS transistor, said absolute-value voltage representing the difference between said first signal voltage and said second signal voltage is output.

5. A semiconductor computing circuit as claimed in claim 4, wherein said write circuit comprises a readout circuit for reading a voltage on a floating gate of a dummy MOS transistor which is equivalent to said first or said second MOS transistor, and a correction voltage computing circuit for computing an output difference of said readout circuit occurring when two voltages, the difference between which is equal to the voltage to be written to said first or said second MOS transistor, are applied one after the other to the control gate of said dummy MOS transistor, and wherein said write circuit writes a voltage equal to said output difference to said first or said second MOS transistor.

6. A semiconductor computing circuit as claimed in claim 4, wherein said first and second MOS transistors are N-channel MOS transistors, and said prescribed voltage is a high-level supply voltage.

7. A semiconductor computing circuit as claimed in claim 4, wherein said first and second MOS transistors are P-channel MOS transistors, and said prescribed voltage is a low-level supply voltage.

8. A semiconductor computing circuit for computing an absolute-value voltage representing the difference between a first signal voltage and a second signal voltage, comprising:

a first MOS transistor having a floating gate and a control gate capacitively coupled to said floating gate;

a second MOS transistor having a floating gate and a control gate capacitively coupled to said floating gate, and whose source electrode is connected to the source electrode of said first MOS transistor;

a write circuit which, with a prescribed voltage multiplied by a positive constant γ smaller than 1 applied to said control gates of said first and second MOS transistors, sets the potential at said floating gate of said first MOS transistor to a value equal to said first signal voltage and also sets the potential at said floating gate of said second MOS transistor equal to a value obtained by subtracting said first signal voltage from said prescribed voltage; and a difference voltage computing circuit for computing a voltage representing a value obtained by subtracting said second signal voltage from said prescribed voltage, and wherein:

after setting said first and second MOS transistors by said write circuit, when the output voltage of said difference voltage computing circuit divided by said constant γ is applied to said control gate of said first MOS transistor while at the same time applying said second signal voltage divided by said constant γ to said control gate of said second MOS transistor, said absolute-value voltage representing the difference between said first signal voltage and said second signal voltage is output.

9. A semiconductor computing circuit as claimed in claim 8, wherein said first and second MOS transistors are N-channel MOS transistors, and said prescribed voltage is a high-level supply voltage.

10. A semiconductor computing circuit as claimed in claim 8, wherein said first and second MOS transistors are P-channel MOS transistors, and said prescribed voltage is a low-level supply voltage.

11. A computing apparatus for computing the sum of absolute differences between corresponding signals in a first signal group and a second signal group each consisting of a predetermined number of signals, comprising:

an individual absolute-value computing circuit having semiconductor computing circuits corresponding in number to said predetermined number of signals and each identical with said semiconductor computing circuit; and a summing circuit for computing the sum of outputs of said semiconductor computing circuits in said individual absolute-value computing circuit, each of said semiconductor computing circuits comprising:

a first MOS transistor having a floating gate and a control gate capacitively coupled to said floating gate;

a second MOS transistor having a floating gate and a control gate capacitively coupled to said floating gate, and whose source electrode is connected to the source electrode of said first MOS transistor;

a write circuit which, with a prescribed voltage applied to said control gates of said first and second MOS transistors, sets the potential at said floating gate of said first MOS transistor to a value equal to a first signal voltage and also sets the potential at said floating gate of said second MOS transistor equal to a value obtained by subtracting said first signal voltage from said prescribed voltage; and a difference voltage computing circuit computing circuit for computing a voltage representing a value obtained by subtracting a second signal voltage from said prescribed voltage, and wherein:

after setting said first and second MOS transistors by said write circuit, when the output voltage of said difference voltage computing circuit is applied to said control gate of said first MOS transistor while at the same time applying said second signal voltage to said control gate of said second MOS transistor, said absolute-value voltage representing the difference between said first signal voltage and said second signal voltage is output.

12. A computing apparatus as claimed in claim 11, wherein said summing circuit comprises:

a plurality of capacitors each having two terminals, the first terminal and the second terminal, wherein the second terminals of said capacitors are connected together to form a common second terminal; and a MOS transistor whose gate electrode is formed from an extended portion of said common second terminal, and wherein:

said source electrodes of said semiconductor computing circuits in said individual absolute-value computing circuit are respectively connected to said first terminals.

13. A computing apparatus as claimed in claim 11, wherein said write circuit in each of said semiconductor computing circuits in said individual absolute-value computing circuit is removable.

14. A computing apparatus as set forth in claim 11, wherein said write circuit comprises a readout circuit for reading a voltage on a floating gate of a dummy MOS transistor which is equivalent to said first or said second MOS transistor, and a correction voltage computing circuit for computing an output difference of said readout circuit occurring when two voltages, the difference between which is equal to the voltage to be written to said first or said second MOS transistor, are applied one after the other to the control gate of said dummy MOS transistor, and wherein said write circuit writes a voltage equal to said output difference to said first or said second MOS transistor.

15. A computing apparatus as set forth in claim 14, wherein said summing circuit comprises:

a plurality of capacitors each having a first terminal and a second terminal, wherein the second terminals of said capacitors are connected together to form a common second terminal; and a MOS transistor whose gate electrode is formed from an extended portion of said common second terminal, and wherein;

said source electrodes of said semiconductor computing circuits in said individual absolute-value computing circuit are respectively connected to said first terminals.

16. A computing apparatus as set forth in claim 14, wherein said write circuit in each of said semiconductor computing circuits in said individual absolute-value computing circuit is removable.

17. A computing apparatus as set forth in claim 11, wherein said prescribed voltage applied to said control gates of said first and second MOS transistors is multiplied by a positive constant γ smaller than 1.

18. A computing apparatus as set forth in claim 17, wherein said summing circuit comprises:

a plurality of capacitors each having two terminals, the first terminal and the second terminal, wherein the second terminals of said capacitors are connected together to form a common second terminal; and a MOS transistor whose gate electrode is formed from an extended portion of said common second terminal, and wherein;

said source electrodes of said semiconductor computing circuits in said individual absolute-value computing circuit are respectively connected to said first terminals.

19. A computing apparatus as set forth in claim 17, wherein said write circuit in each of said semiconductor computing circuits in said individual absolute-value computing circuit is removable.

* * * * *

UNITED STATES PATENT AND TRADEMARK OFFICE

CERTIFICATE OF CORRECTION

PATENT NO. : 6,493,263 B1
DATED : December 10, 2002
INVENTOR(S) : Tadashi Shibata et al.

It is certified that error appears in the above-identified patent and that said Letters Patent is hereby corrected as shown below:

Column 16,
Line 44, "ate" should read -- gate --.

Column 18,
Lines 34-35, delete the second occurrence of "computing circuit".

Signed and Sealed this

Seventh Day of October, 2003

JAMES E. ROGAN
*Director of the United States Patent and Trademark Office*